United States Patent [19]
Balakrishnan et al.

[11] Patent Number: 5,245,526
[45] Date of Patent: Sep. 14, 1993

[54] BELOW GROUND CURRENT SENSING WITH CURRENT INPUT TO CONTROL THRESHOLD

[75] Inventors: Balu Balakrishnan, Saratoga; Leif O. Lund, San Jose; Richard A. Keller, Palo Alto, all of Calif.

[73] Assignee: Power Integrations, Inc., Mountain View, Calif.

[21] Appl. No.: 832,227

[22] Filed: Feb. 7, 1992

[51] Int. Cl.$^5$ .......................................... H02M 3/335
[52] U.S. Cl. ...................... 363/97; 307/362; 323/284
[58] Field of Search ............ 363/21, 97, 131; 323/282, 284; 361/93; 307/362

[56] References Cited

U.S. PATENT DOCUMENTS

| | | | |
|---|---|---|---|
| 4,533,863 | 8/1985 | Luhn et al. | 322/28 |
| 4,764,856 | 8/1988 | Rausch | 363/21 |
| 5,057,765 | 10/1991 | Clark et al. | 323/282 |

FOREIGN PATENT DOCUMENTS 31470 2/1988 Japan .

*Primary Examiner*—William H. Beha, Jr.
*Attorney, Agent, or Firm*—Thomas E. Schatzel

[57] ABSTRACT

An embodiment of the present invention is a switching power supply with high voltage positive and negative power inputs, a system ground, a sensing resistor placed between the negative power input and system ground, first and second load outputs with the first load output connected to the positive power input, and a comparator having first and second comparison inputs and a comparison output with the second comparison input connected to the system ground. A constant-current source is connected to the first comparison input of the comparator. A power MOSFET switch transistor has its drain connected to the second load output, its source connected to the system ground, and its gate controlled by the comparison output of the comparator. And a control resistor is connected between the second power input and said first comparison input of the comparator. The constant-current source, control resistor, and sensing resistor are such that when a predetermined current flowing through the first and second load outputs reaches a predetermined level (the current limit), the voltage developed across the sensing resistor will be equal to the voltage dropped across the control resistor, and the comparator will turn off the transistor to prevent further current increases.

8 Claims, 6 Drawing Sheets

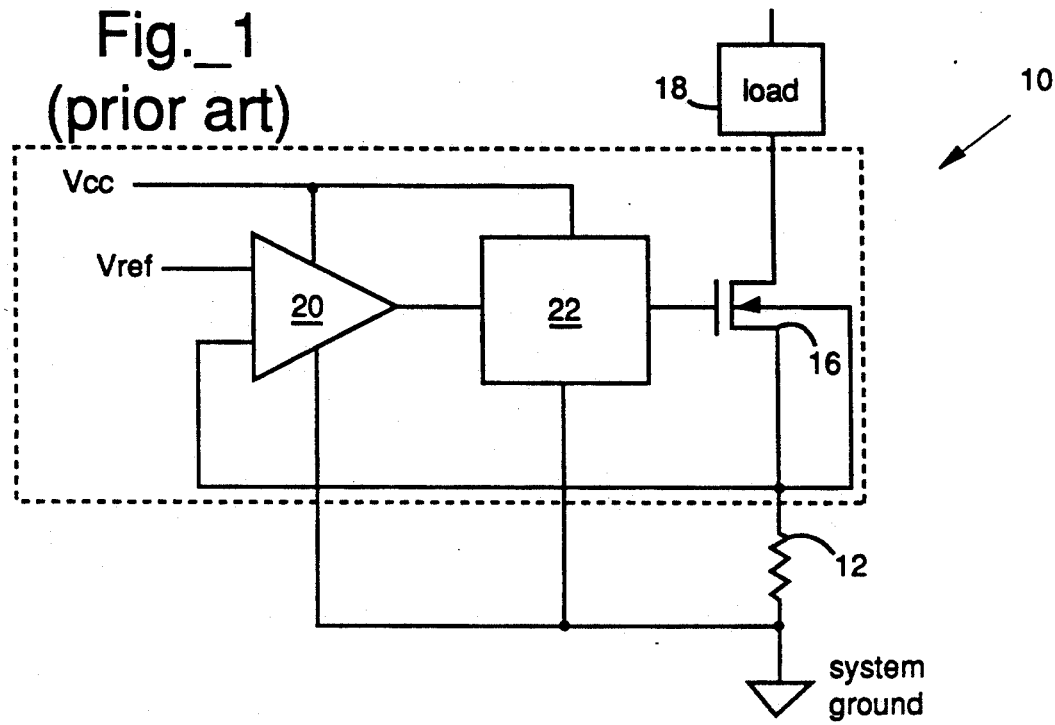
Fig._1 (prior art)
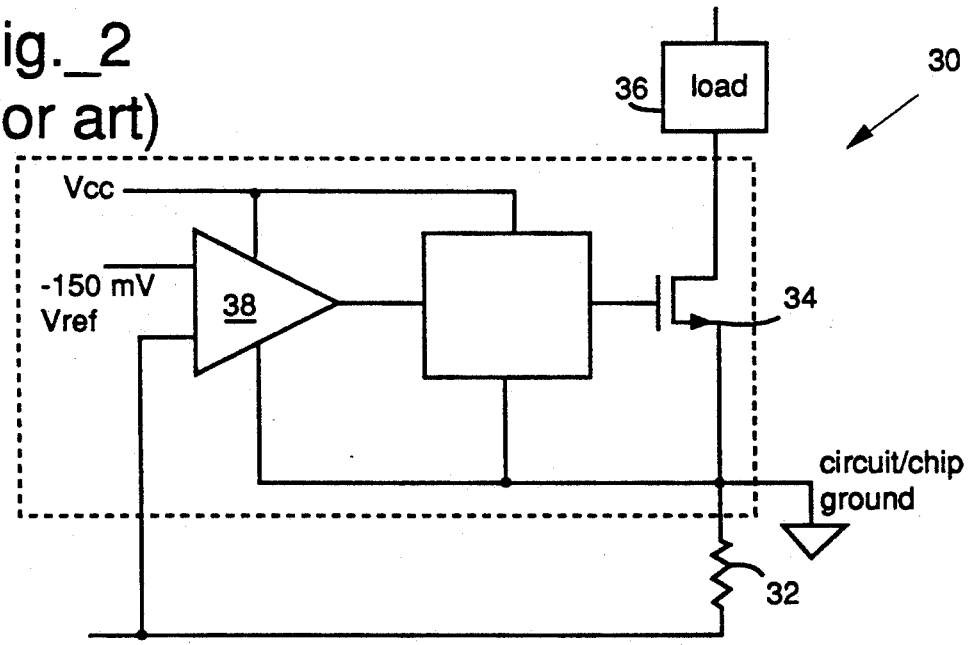
Fig._2 (prior art)

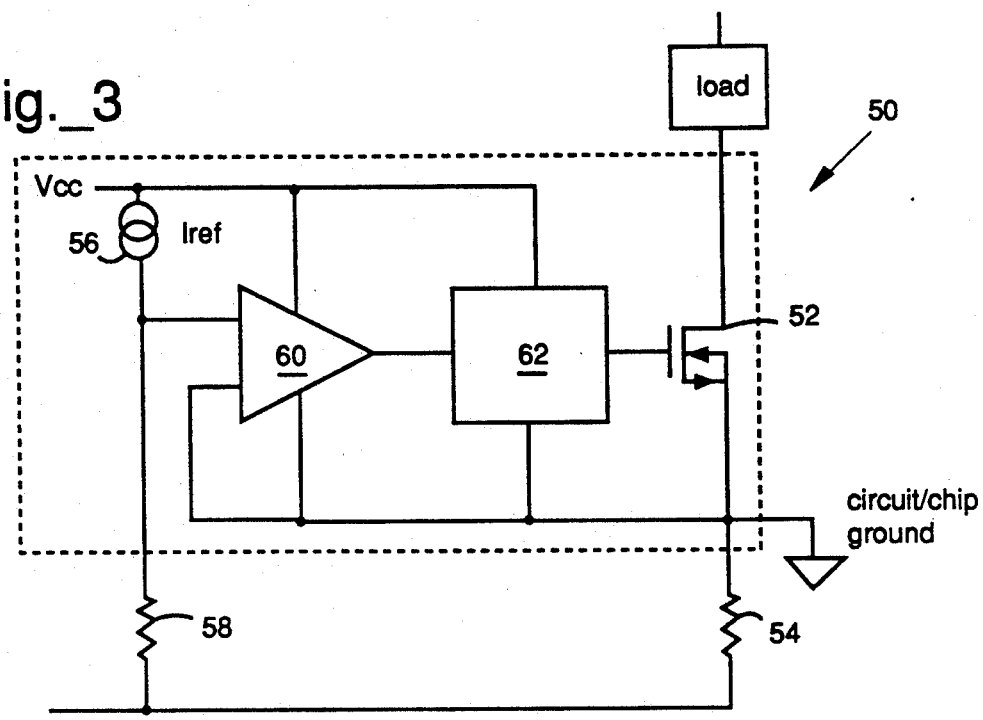
Fig._3
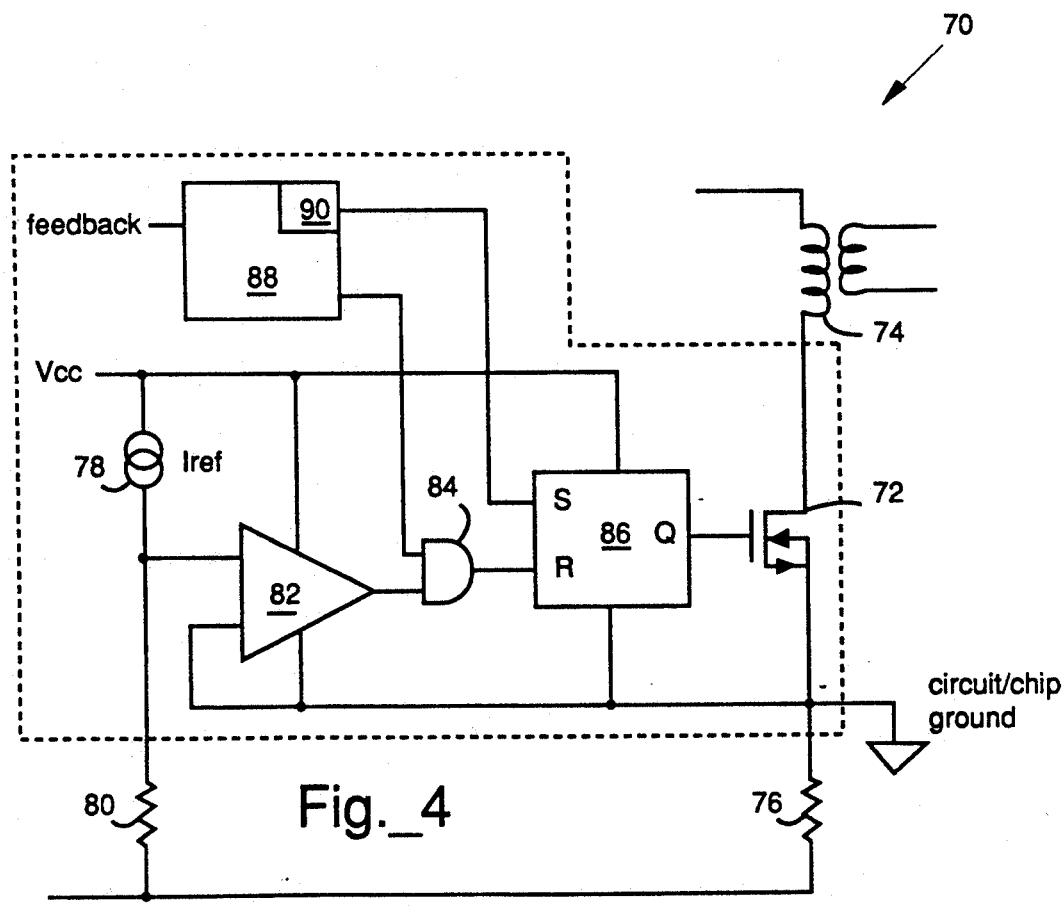
Fig._4

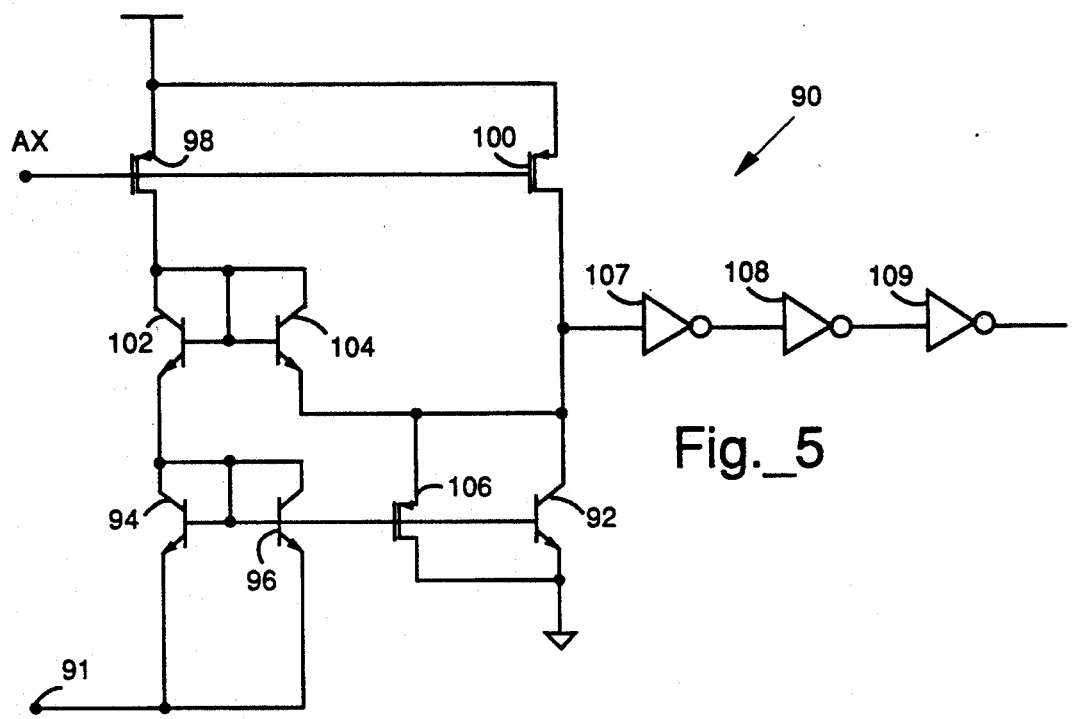
Fig._5
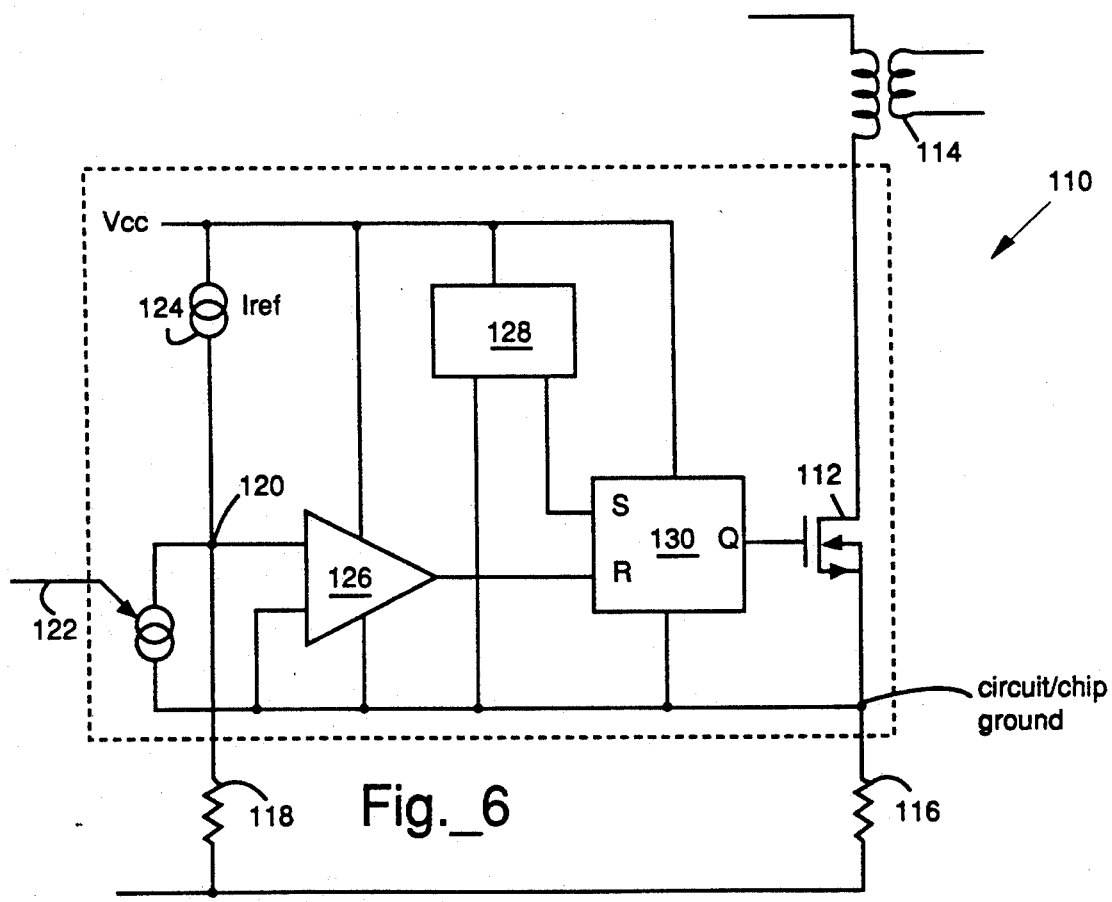
Fig._6

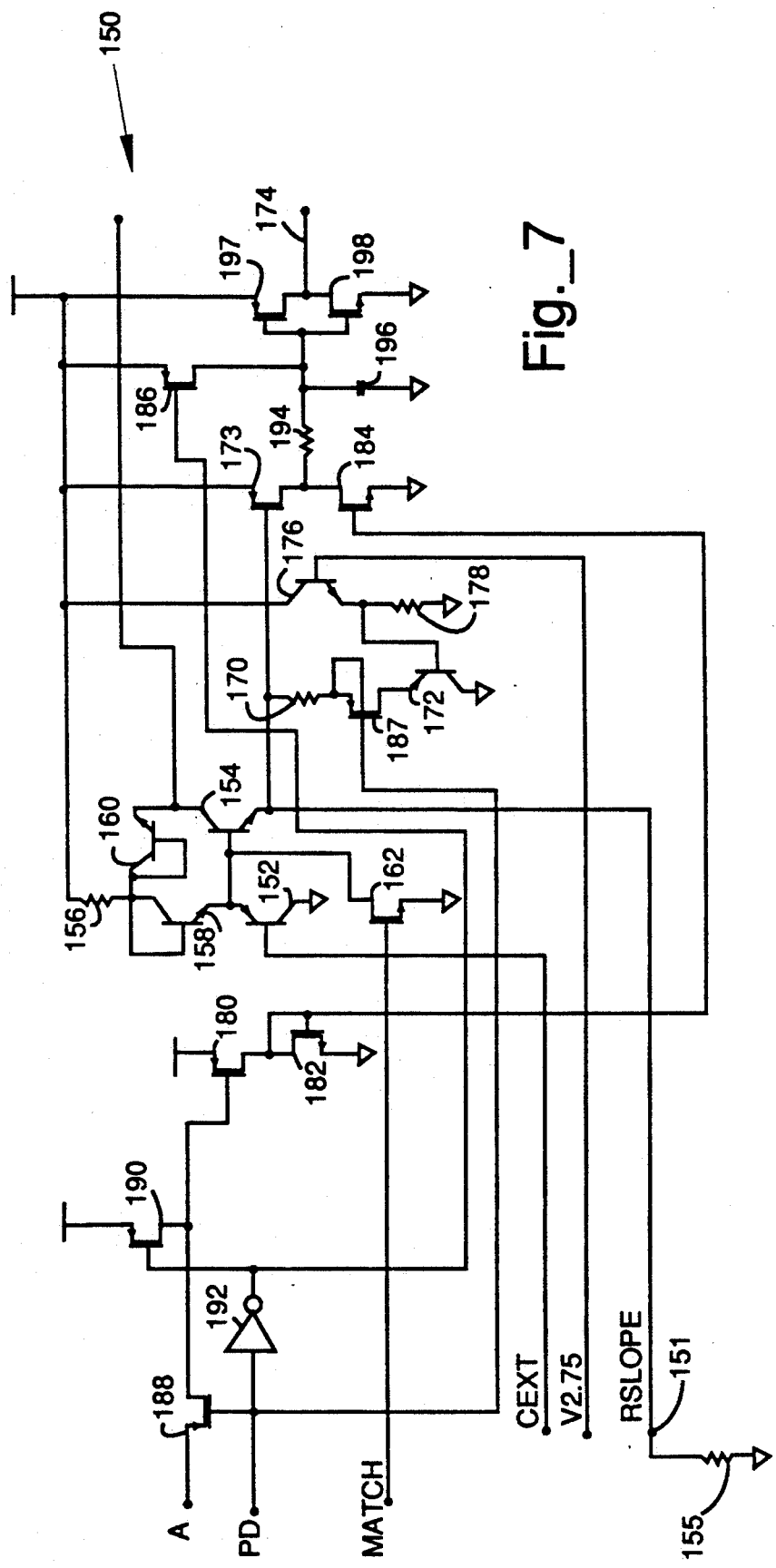

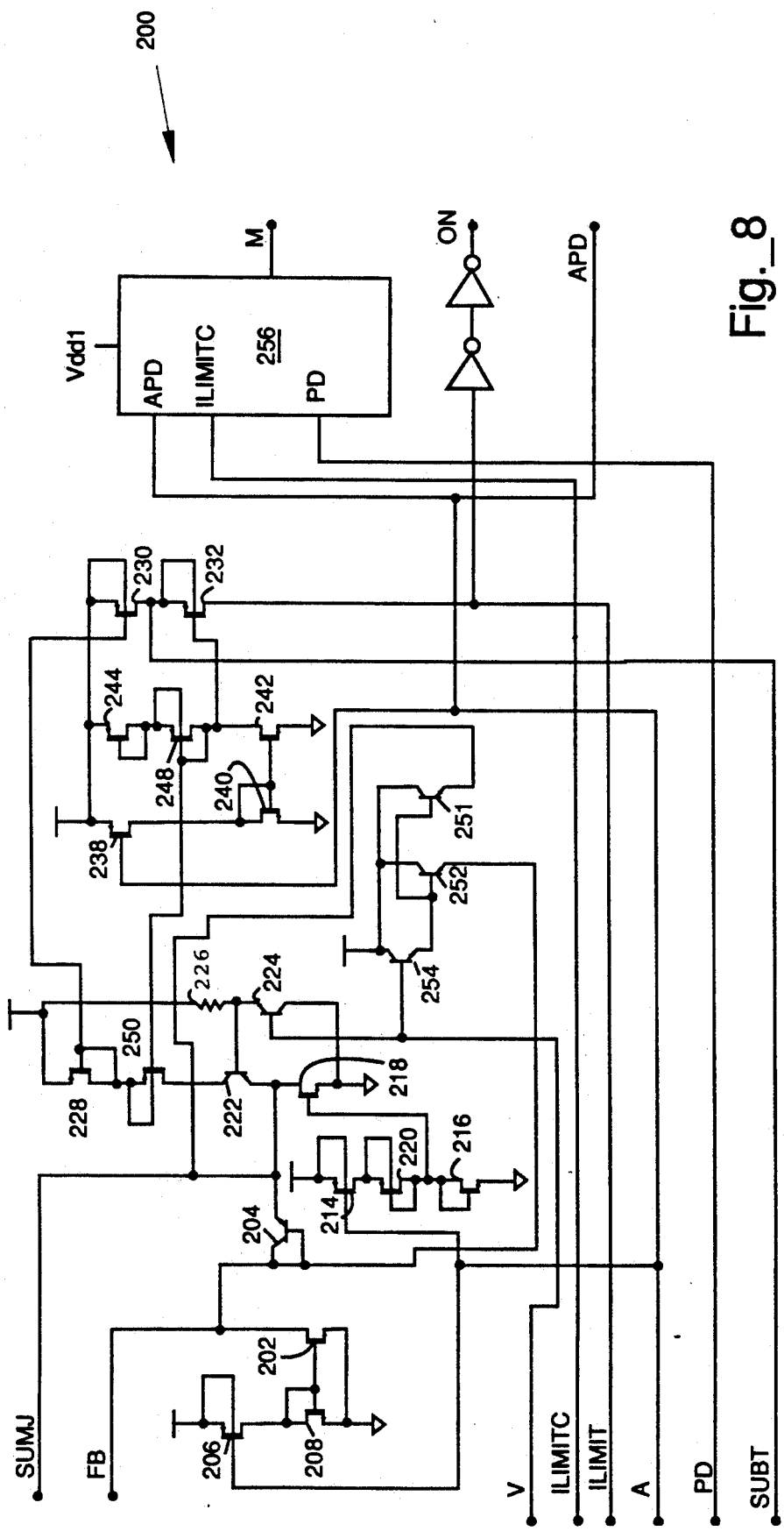
Fig._8

BELOW GROUND CURRENT SENSING WITH CURRENT INPUT TO CONTROL THRESHOLD

BACKGROUND OF THE INVENTION

1. Field of the Invention

The present invention relates to electronic power supplies and specifically to methods of measuring and limiting current delivered to a load.

2. Description of the Prior Art

Two types of power supplies are in wide use that convert an incoming source to voltage levels useful to the equipment being powered. Linear power supplies are the simplest, a series transistor typically drops enough voltage across it to maintain a constant output voltage. The problem with linear power supplies is that the heavier the output load, the more current will have to pass through the regulating transistor, since it is in series with the load. This increased current means more power must be dissipated by the transistor, and this power is thrown away as heat. Switching power supplies are more efficient and run cooler than linear power supplies at the same power levels. But switching power supplies are more complicated because a transistor operated as a switch is used to chop incoming current for a transformer that has the load connected to its secondary winding, usually through a rectifier and filter. A feedback circuit is needed to monitor the output voltage and increase the time duration the chopping transistor is on when more output voltage is needed and to reduce the time duration when less output voltage is needed. The feedback circuit often makes use of a third winding of the transformer. The advantages of the switching power supply are that they can operate either as step-up or step-down supplies, by adjusting the number of series conductors in the primary and secondary windings of the transformer, and less heat is dissipated by the transistor since it never operates in its linear region. The transistor is either fully off or fully on.

A problem develops in power supplies that use current limiting. A conventional method of current limiting in a pulse width modulation (PWM) type switching power supply is shown in FIG. 1. A power supply 10 has a resistor (Rs) 12 in series with a power switch transistor 16 and a load 18. A sense voltage (Vs) develops across Rs 12 that is the product of the current and the resistance (Ohm's Law). This voltage is sensed by an input of an comparator 20 and compared to a reference voltage (Vref). A logic block 22 accepts the comparison from comparator 20 and controls the gate of transistor 16. As Vs exceeds Vref, transistor 16 will turn off. When Vs drops below Vref, transistor 16 will turn on. The total effect is to limit the current through transistor 16, and therefore load 18, to a value that can be adjusted by Vref. The disadvantages of putting Rs 12 where it is, include reduced gate drive at higher currents because the Vt of transistor 16 increases and the source lifts from ground as more Vs develops. To combat this, the value of Rs 12 is kept very low, on the order of 0.1 ohms. But at such low resistance values, the trace resistance on a printed circuit board can become significant, and can ruin any precision. An accurate reference source is needed to produce Vref. And low values of Vs, which can typically be 200 millivolts, do not compete with noise very well. The current mode control which requires dynamic adjustment of the current limit based on several control inputs is difficult to implement.

In FIG. 2, a switching power supply control circuit 30 puts a sense resistor (Rs) 32 "below ground." A current (Is) through Rs 32 also passes through a switch transistor 34 and a load 36. A negative sense voltage (−Vs) develops across Rs 32 as a result of Is because circuit or chip ground is at the junction of Rs 32 and transistor 34. An comparator 38 must have a negative reference voltage (−Vref) so that it can compare −Vs. Although the problem of transistor source terminal lifting has been avoided, the negative −Vref is troublesome to derive. Only small threshold voltages can be used (e.g., 150–200 millivolts) if power supply 30 is implemented mostly on a chip, larger thresholds will forward bias the substrate of the chip.

What is needed is a method and apparatus for accurate current limiting without the problems inherent in the prior art.

SUMMARY OF THE PRESENT INVENTION

It is therefore an object of the present invention to provide a switching power supply with improved current limiting characteristics.

Briefly, an embodiment of the present invention is a switching power supply with high voltage positive and negative power inputs, a system ground, a sensing resistor placed between the negative power input and system ground, first and second load outputs with the first load output connected to the positive power input, and a comparator having first and second comparison inputs and a comparison output with the second comparison input connected to the system ground. A constant-current source is connected to the first comparison input of the comparator. A power MOSFET switch transistor has its drain connected to the second load output, its source connected to the system ground, and its gate controlled by the comparison output of the comparator. And a control resistor is connected between the second power input and said first comparison input of the comparator. The constant-current source, control resistor, and sensing resistor are such that when a predetermined current flowing through the first and second load outputs reaches a predetermined level (the current limit), the voltage developed across the sensing resistor will be equal to the voltage dropped across the control resistor, and the comparator will turn off the transistor to prevent further current increases.

An advantage of the present invention is that gate drive is constant and independent of output current.

Another advantage of the present invention is that larger sense resistor values can be used because Vs no longer subtracts away from output transistor gate drive.

Another advantage of the present invention is that no voltage reference is necessary.

Another advantage of the present invention is that the current limit can be easily programmed by the control resistor $R_{CL}$, which is a much larger value than is found in the prior art.

These and other objects and advantages of the present invention will no doubt become obvious to those of ordinary skill in the art after having read the following detailed description of the preferred embodiments which are illustrated in the various drawing figures.

IN THE DRAWINGS

FIG. 1 is a block diagram of a prior art switching power supply with a sense resistor between the switching transistor and ground;

FIG. 2 is a block diagram of a prior art switching power supply with below ground voltage sensing;

FIG. 3 is a block diagram of a switching power supply, according to an embodiment of the present invention;

FIG. 4 is a block diagram of a voltage mode PWM controller power supply, according to an embodiment of the present invention;

FIG. 5 is a schematic diagram of a comparator suitable for use in the power supply of FIGS. 3 and 4;

FIG. 6 is a block diagram of a current mode controller, according to an embodiment of the present invention; and FIG. 7 is a schematic diagram of a slope compensator, as used in FIG. 6;

FIG. 8 is a schematic diagram of an exemplary summing junction, such as used in FIG. 7.

DETAILED DESCRIPTION OF THE EMBODIMENTS

Figure 9:
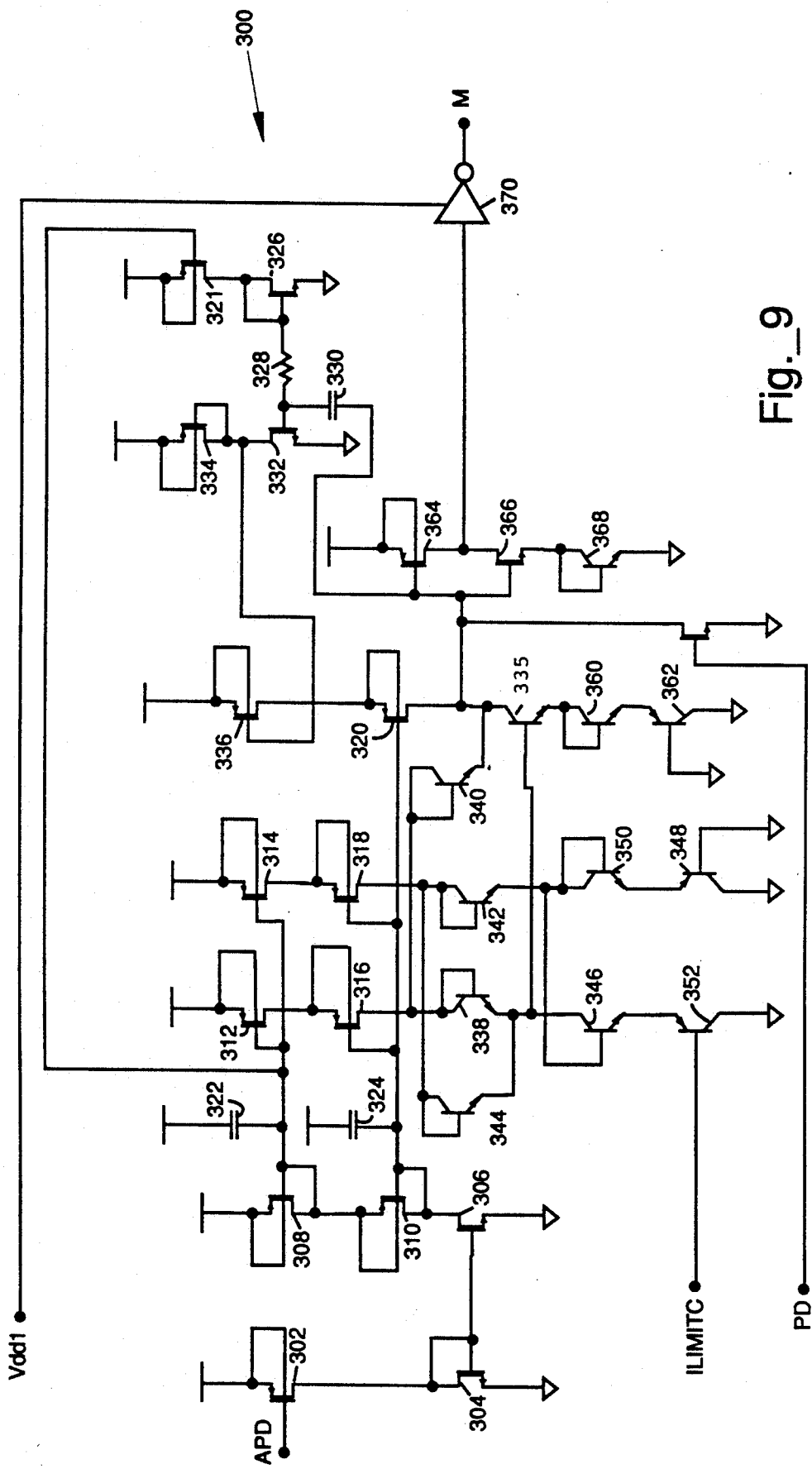
FIG. 9 is a schematic diagram of an exemplary summing junction comparator, as used in FIG. 8.

In FIG. 3, a first embodiment of the present invention is a switching power supply 50 comprising a switching transistor 52, a sense resistor (Rs) 54, a constant current source 56, a current limit resistor ($R_{CL}$) 58, an comparator 60, and a logic block 62. Transistor 52 is typically a power MOSFET. Output current (Io) passing through transistor 52 also passes through Rs 54, since they are in series, and a voltage (Vs) develops across Rs 54. A current ($I_{CL}$) passing through constant current source 56 also passes through $R_{CL}$ 58. When $I_{CL}$ times $R_{CL}$ equals Vs, the ungrounded input terminal of comparator 60 will be at zero volts. If Vs increases because Io increases, comparator 60 will act through logic block 62 to turn off transistor 52. If Vs decreases because Io decreases, comparator 60 will act through logic block 62 to turn on transistor 52. The net effect is to limit current. The point the current is limited to can easily be adjusted by varying the value of $R_{CL}$ 58 or the current sourced by constant current source 56. Typical constant current values are 150-500 microamps. Values for RCL often range from 2K-10K ohms. The alternating current (AC) value of a sense current waveform is not affected when a current limit voltage is changed, because the current source develops a voltage across $R_{CL}$ 58 which merely level shifts the sense voltage. In the prior art, attempts to scale the sense voltage also scale the AC waveform. A critical advantage is that a current input for controlling the current limit threshold allows for an easy implementation of a current mode controller using a simple current summing junction to combine multiple control inputs such as feedback, slope compensation, feed forward, soft start safety current limit, et cetera.

In FIG. 4, a second embodiment of the present invention is a voltage mode PWM controller power supply 70 comprising a high voltage switch 72 in series with the primary of a transformer 74 and a sense resistor (Rs) 76, a constant current source 78 in series with a resistor (RCL) 80, an comparator 82, a two-input AND-gate 84, a set-reset (SR) flip-flop 86, a PWM controller 88 having an oscillator 90. PWM controller 88 turns on the high voltage switch 72 every cycle of oscillator 90 by setting flip-flop 86.

In FIG. 5, a comparator 90, is an example of what can be used in place of op-amps 60 and 82, and comprises a comparator input 91 that is compared with the voltage on the emitter of a transistor 92 (here, ground). A pair of transistors 94 and 96 act as an emitter-follower in order to compensate for $V_{be}$ in input transistor 92. A transistor 98 and a transistor 100 are constant current sources, the first delivering about 100 microamperes and the latter delivering fifty microamperes. Transistors 92, 94 and 96 are the same size transistors in order not to generate any offsets. A pair of transistors 102 and 104 guarantee that transistor 92 cannot saturate when the comparator input 91 goes HIGH. A transistor 106 is a relatively weak clamp that forces the collector of transistor 92 to stay short of rising completely to $V_{dd}$, in order to improve speed. A set of three inverters 107-109 provide additional gain and an appropriate output polarity.

In FIG. 6, a current mode controller 110, according to a fourth embodiment of the present invention, comprises a switch transistor 112, a transformer 114, a sense resistor (Rs) 116, a current limit control resistor 118, a current summing node 120 that receives a control current 122 and a current (Iref, typically 500 microamperes) from constant current source 124, a comparator 126, an oscillator 128, and a set-reset flip-flop 130. Control current 122 comprises a slope compensation (Isc), a soft start (Iss), a feed forward (Iff), and a feed back (Ifb, typically 0-500 microamperes) constituent currents. The current limit current ($I_{CL}$) flowing through resistor 118 is Iref-Ifb-Iff-Isc-Iss.

FIG. 7 shows a slope compensator 150 that derives its slope compensation from an OSC ramp and an external resistor input (RSLOPE) 151 to fix a current for subtraction from a summing junction Isc. Slope compensator 150 accepts the OSC ramp (typically a 0-1.75 volt sawtooth) at the base of a transistor 152 and the emitter of a transistor 154 after buffering. RSLOPE input 151 connects to the emitter of transistor 154. An external resistor 155 will set the slope compensation current. A resistor 156 provides the necessary bias currents for transistors 152 and 154. A pair of transistors 158 and 160 keep transistor 154 from saturating. A transistor 162 turns off the slope compensation ramp when an external high voltage switch transistor (e.g., transistor 112) turns off (MATCH goes HIGH). A resistor 170 and a transistor 172 soft clamp RSLOPE input 151 to about 2.75 volts. The soft clamp is needed for instances when RSLOPE input 151 is left open. If RSLOPE input 151 goes too high, a transistor 173 turns off, and an output 174 will go HIGH. A transistor 176 and a resistor 178 form a bias generator for the base of transistor 172 such that the gate of transistor 173 is 2.75 volts and transistor 173 is conducting (node 174 is LOW). A pair of transistors 180 and 182 convert the current reference from VS to GND. In the comparator, a transistor 184 sinks a fixed current of about twenty microamperes, and when transistor 173 turns on, that current will be overridden and the drain of transistor 184 will be forced HIGH. A group of transistors 186, 187, 188, and 190, and an inverter 192 are used in a power-down circuit. A resistor 194 and a capacitor 196 form a low pass filter so noise on the RSLOPE input 151, when left open, will not trigger the comparator into a LOW (50% mode). A pair of transistors 197 and 198 form an inverter to output 174.

FIG. 8 is a schematic diagram of a typical summing junction 200, such as is mentioned above in conjunction with FIG. 7. Summing junction 200 has a transistor 202 that sinks 480 microamperes from a feedback (FB) input with excess current passing through a transistor 204. A sixty microampere current in a transistor 206 is mirrored via a transistor 208 and multiplier by a factor of eight in transistor 202. A thirty microampere current in a transistor 214 is mirrored via a pair of transistors 216 and 218 and multiplied by eight. A transistor 220 lowers the effects of channel length modulation in transistor 214. Transistor 204 acts as a diode in prohibiting current flow from the emitter of a transistor 222 to the drain of transistor 202. Transistor 222, a transistor 224, and a resistor 226 buffer a relatively high impedance node "V" (at 1.25 volts) to a low impedance at the emitter of transistor 222. A transistor 228 mirrors to a transistor 230 a current resulting from subtracting currents FB, FF, and SUMJ from a 240 microampere current in transistor 218. Switching noise is prevented from getting to current reference "A" by a buffer comprising a current mirror transistor 240 (running at about fifteen microamperes) and a transistor 242 (running at about sixty microamperes). A transistor 244 matches the Vgs of transistor 230 in a parallel branch. A transistor 248 generates a bias voltage for a transistor 250 and transistor 232, which are cascode transistors. A plurality of transistors 251, 252, and 254 are input clamps and are not involved in the function of the summing junction. A summing junction comparator (COMPSJ) 256 is described below in more detail.

FIG. 9 is a schematic diagram of a typical summing junction comparator 300, such as COMPSJ 256 (FIG. 8). Summing junction comparator 300 accepts a current reference signal APD which makes a transistor 302 conduct about thirty microamperes. This current is mirrored from a transistor 304 into a sixty microampere current in a transistor 306. A pair of transistors 308 and 310 form a cascode current reference for a plurality of transistors 312, 314, 316, 318, 320, and 321. Transistors 314 and 318 generate a 50% higher current than transistors 312 and 316 so that a positive offset can be created on an ILIMITC input. The offset is about 21 millivolts (2·10.5 mV). A pair of capacitors 322 and 324 suppress any noise on respective bias lines. A bootstrap circuit comprises transistors 321 and a transistor 326, a resistor 328, a capacitor 330, and a pair of transistors 332 and 334. Transistor 326 mirrors the thirty microampere current to transistor 332 via resistor 328. Capacitor 330 forces transistor 332 to turn on harder when the collector of a transistor 335 goes HIGH. More current is then forced through a transistor 336, speeding up the LOW to HIGH transitions of the comparator. A pair of transistors 338 and 340 keep transistor 335 from saturating. A pair of transistors 342 and 344 keep a transistor 346 out of saturation. The comparator input stage comprises the reference voltage stage with a pair of transistors 348 and 350 and a pair of input transistors 352 and 354. Each has its own current source. A second comparator stage has current source transistors 336 and 320 and transistor 335 together with a pair of transistors 360 and 362 that match the input stage in its configuration, transistor sizes, and current. Comparator 300 further comprises an output stage consisting of a transistor 364, a transistor 366, a transistor 368, and an inverter 370.

Comparator 300 delivers high speed at low levels of power consumption. Typical rise and fall times at 360 microamperes are about 25 nanoseconds. Comparator 300 comprises two reference current mirror stages, a reference voltage stage, and input and output stages. One of the current mirrors is used to set up a fixed current through the reference voltage stage and input stage. The other current mirror is such that bootstrapping is allowed so the LOW to HIGH transitions can be sped up. The input stage gets its reference voltage from the reference voltage stage which is matched with the input stage (in terms of the current ratios and the component sizes). A positive offset of twenty millivolts requires a 50% higher current to be forced through the reference voltage stage. The output stage has itself a three stage circuit where the first sub-stage current and components are matched to the input stage. The second and third sub-stages consist of one inverter each.

Although the present invention has been described in terms of the presently preferred embodiments, it is to be understood that the disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

What is claimed is:

1. A system with current-limited output, the system comprising:
first and second power input terminals;
a system ground;
a sensing resistor between the second power input terminal and system ground;
first and second load terminals, the first load output terminal connected to the first power input terminal;
a comparator having a first and a second comparison input and a comparison output, said second comparison input connected to the system ground;
fixed voltage offset means for developing an offset voltage near ground potential from the second power input terminal when a current passing through the sensing resistor is at a control value and said offset voltage being applied to said first comparison input of the comparator;
a transistor having a drain connected to the second load output terminal, a source connected to the system ground, and a gate controlled by said comparison output of the comparator wherein a voltage developed across the sensing resistor is controlled to be substantially equal to said offset voltage.

2. The system of claim 1, wherein:
the fixed voltage offset means and sensing resistor are sized such that when a current flowing through the first and second load outputs reaches a predetermined level, the transistor may limit further increases.

3. The system of claim 1, further comprising:
logic means with an input connected to the comparator output and an output connected to said gate of the transistor for controlling said gate of the transistor.

4. The system of claim 3, wherein:
the logic means comprises an oscillator, a flip-flop, and a gate wherein said oscillator is coupled to said flip-flop and the transistor for controlling a current through the transistor by pulse width modulation of said gate.

5. A power supply, comprising:
positive and negative power input terminals;
a system ground;
a sensing resistor connected between the negative power input terminal and system ground;

first and second load output terminals, the first load output terminal connected to the positive power input terminal;

a comparator having a first and a second comparison input and a comparison output, said second comparison input connected to the system ground;

fixed voltage offset means for adding an offset voltage to a voltage at the negative power input terminal and for developing a positively-offset negative power input terminal voltage at said first comparison input of the comparator that is approximately equal to ground potential when a current passing through the sensing resistor is substantially equal to a level to be maintained by closed-loop servo control;

a power MOSFET switch transistor having a drain connected to the second load output terminal, a source connected to the system ground, and a gate controlled by said comparison output of the comparator.

6. The power supply of claim 5, further comprising:

a transformer with a primary winding connected to the first and second load output terminals.

7. A current mode controller, comprising:

a switching transistor;

a load transformer having a primary winding in series with the switching transistor;

a sense resistor in series with the switching transistor and a first input terminal for an external power source;

a current limit control resistor for connecting one end to said first input terminal;

a current summing node for receiving a reference current (Iref) from a constant current source and a control current including constituent currents for slope compensation (Isc), soft start (Iss), feed forward (Iff), and feedback (Ifb);

a set-reset flip-flop;

a comparator having a first input connected to the current summing node and a second input connected to a chip ground at a junction of the switching transistor and the sense resistor and an output for controlling the switching transistor by resetting the set-reset flip-flop; and an oscillator for setting the set-reset flip-flop.

8. The controller of claim 7, further comprising:

reference current means for generating said reference current (Iref) of approximately 500 microamperes;

slope compensation means for generating said slope compensation current (Isc);

soft start means for generating said soft start current (Iss) wherein current initially deliverable by the controller has a safety limit;

feed forward means for generating said feed forward current (Iff) for control loop compensation for changes in input voltage; and feedback means for generating said feedback current (Ifb) in the range of 0-500 microamperes for providing a closed-loop servo control of the controller.

* * * * *